(12) United States Patent
Otremba et al.

(10) Patent No.: US 12,205,870 B2
(45) Date of Patent: Jan. 21, 2025

(54) SEMICONDUCTOR PACKAGE AND METHOD FOR FABRICATING A SEMICONDUCTOR PACKAGE

(71) Applicant: Infineon Technologies Austria AG, Villach (AT)

(72) Inventors: Ralf Otremba, Kaufbeuren (DE); Paul Frank, Villach (AT); Alexander Heinrich, Bad Abbach (DE); Alexandra Ludsteck-Pechloff, Unterhaching (DE); Daniel Pedone, Munich (DE)

(73) Assignee: Infineon Technologies Austria AG, Villach (AT)

(*) Notice: Subject to any disclaimer, the term of this patent is extended or adjusted under 35 U.S.C. 154(b) by 0 days.

(21) Appl. No.: 18/197,800

(22) Filed: May 16, 2023

(65) Prior Publication Data
US 2023/0290709 A1 Sep. 14, 2023

Related U.S. Application Data

(62) Division of application No. 17/079,587, filed on Oct. 26, 2020, now Pat. No. 11,688,670.

(30) Foreign Application Priority Data

Nov. 4, 2019 (EP) .................................. 19206963

(51) Int. Cl.
*H01L 23/495* (2006.01)
*H01L 21/78* (2006.01)
*H01L 23/00* (2006.01)

(52) U.S. Cl.
CPC ........ *H01L 23/49513* (2013.01); *H01L 24/27* (2013.01); *H01L 24/29* (2013.01); *H01L 24/32* (2013.01); *H01L 24/83* (2013.01); *H01L 21/78* (2013.01); *H01L 23/49579* (2013.01); *H01L 2224/2745* (2013.01); *H01L 2224/29109* (2013.01); *H01L 2224/29111* (2013.01); *H01L 2224/29139* (2013.01); *H01L 2224/29144* (2013.01); *H01L 2224/29147* (2013.01); *H01L 2224/29155* (2013.01); *H01L 2224/32245* (2013.01); *H01L 2224/32507* (2013.01); (Continued)

(58) Field of Classification Search
CPC ....... H01L 2224/8382; H01L 23/49513; H01L 23/49579; H01L 21/78
See application file for complete search history.

(56) References Cited

U.S. PATENT DOCUMENTS 6,452,270 B1 * 9/2002 Huang .................... H01L 24/11
257/737
6,828,220 B2 12/2004 Pendse et al.
(Continued)

FOREIGN PATENT DOCUMENTS

WO 2006074165 A2 7/2006

*Primary Examiner* — Dale E Page
*Assistant Examiner* — Wilner Jean Baptiste
(74) *Attorney, Agent, or Firm* — Murphy, Bilak & Homiller, PLLC

(57) ABSTRACT

A semiconductor package includes a power semiconductor chip comprising SiC, a leadframe part including Cu, wherein the power semiconductor chip is arranged on the leadframe part, and a solder joint electrically and mechanically coupling the power semiconductor chip to the leadframe part, wherein the solder joint includes at least one intermetallic phase.

20 Claims, 4 Drawing Sheets

(52) U.S. Cl.
CPC .............. *H01L 2224/83203* (2013.01); *H01L 2224/8381* (2013.01); *H01L 2224/8382* (2013.01); *H01L 2924/10272* (2013.01); *H01L 2924/15747* (2013.01)

(56) References Cited

U.S. PATENT DOCUMENTS

| | | |
|---|---|---|
| 2007/0166877 A1 | 7/2007 | Otremba |
| 2011/0031505 A1* | 2/2011 | Harada ............. H01L 21/02516 257/77 |
| 2012/0061812 A1 | 3/2012 | Otremba |
| 2012/0208323 A1* | 8/2012 | Heinrich ........... H01L 23/49513 438/123 |
| 2012/0235227 A1 | 9/2012 | Otremba et al. |
| 2015/0294920 A1 | 10/2015 | Asai et al. |
| 2017/0144221 A1* | 5/2017 | Ghoshal ............... B23K 1/0016 |
| 2017/0250172 A1 | 8/2017 | Huang et al. |
| 2021/0336026 A1* | 10/2021 | Yun .................... H01L 29/4966 |

\* cited by examiner

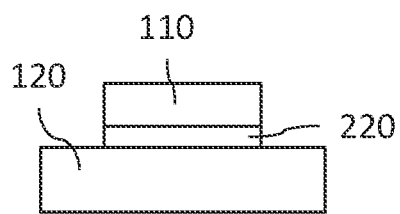
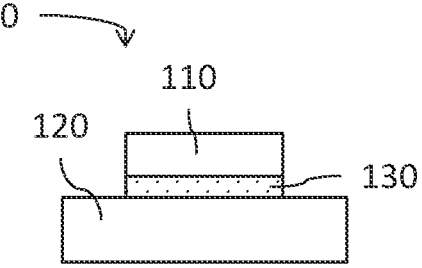
Fig. 2E
Fig. 2F
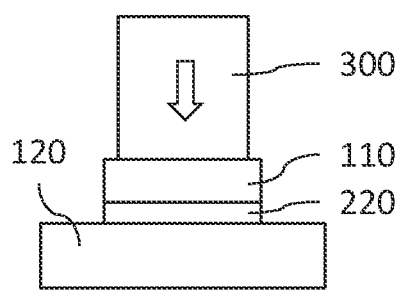
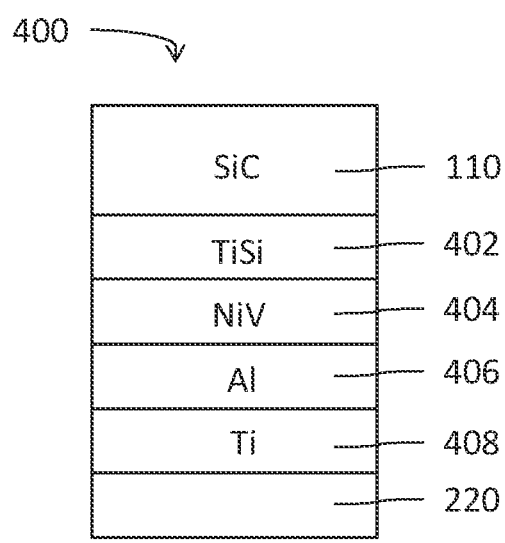
Fig. 3
Fig. 4

SEMICONDUCTOR PACKAGE AND METHOD FOR FABRICATING A SEMICONDUCTOR PACKAGE

TECHNICAL FIELD

This disclosure relates in general to a semiconductor package and to a method for fabricating a semiconductor package.

BACKGROUND

A semiconductor package, in particular a semiconductor package comprising a semiconductor chip that is configured to handle a high voltage and/or a high electrical current (power semiconductor chip), may produce a significant amount of heat during operation. Properly cooling such a semiconductor package may therefore be challenging. Cooling may for example be done via a thermal pathway that comprises the die carrier onto which the power semiconductor chip is attached. The efficiency of the cooling may depend on the thermal resistance along this thermal pathway. Furthermore, attaching the power semiconductor chip to the die carrier may be done by soldering, which however may result in solder bleed-out. Solder bleed-out may take up space on the surface of the die carrier and/or may even create a short-circuit fault. Improved semiconductor packages and improved methods for fabricating a semiconductor package may help to solve these and other problems.

The problem on which the disclosure is based is solved by the features of the independent claims. Further advantageous examples are described in the dependent claims.

SUMMARY

Various aspects pertain to a semiconductor package, comprising: a power semiconductor chip comprising SiC, a leadframe part comprising Cu, wherein the power semiconductor chip is arranged on the leadframe part, and a solder joint electrically and mechanically coupling the power semiconductor chip to the leadframe part, wherein the solder joint comprises at least one intermetallic phase.

Various aspects pertain to a method for fabricating a semiconductor package, the method comprising: providing a SiC semiconductor wafer comprising a plurality of power transistor circuits, depositing a first metal layer on the SiC semiconductor wafer, singulating the SiC semiconductor wafer into individual power semiconductor chips, each power semiconductor chip comprising at least one power transistor circuit, providing a leadframe part comprising Cu, arranging at least one of the power semiconductor chips on the leadframe part such that the first metal layer faces the leadframe part, and diffusion soldering the at least one power semiconductor chip to the leadframe part such that the first metal layer and the leadframe part form at least one intermetallic phase.

BRIEF DESCRIPTION OF THE DRAWINGS

The accompanying drawings illustrate examples and together with the description serve to explain principles of the disclosure. Other examples and many of the intended advantages of the disclosure will be readily appreciated as they become better understood by reference to the following detailed description. The elements of the drawings are not necessarily to scale relative to each other. Identical reference numerals designate corresponding similar parts.

FIGS. 2A to 2F are schematic cross section views of a semiconductor package in various stages or fabrication according to a method for fabricating a semiconductor package.

FIG. 3 is a cross section view of a power semiconductor chip that is pressed down onto a leadframe part.

FIG. 4 is a cross section view of a stack comprising a power semiconductor chip and a plurality of metal layers.

DETAILED DESCRIPTION

In the following detailed description, reference is made to the accompanying drawings, in which is shown by way of illustration, specific examples in which the disclosure may be practiced. In this regard, directional terminology, such as "top", "bottom", "front", "back", "upper". "lower" etc., is used with reference to the orientation of the Figure(s) being described. Because components of examples can be positioned in a number of different orientations, the directional terminology is used for purposes or illustration and is in no way limiting.

As employed in this specification, the terms "bonded", "attached", "connected" "coupled" and/or "electrically connected/electrically coupled" are not meant to mean that the elements or layers must directly be contacted together; intervening elements or lavers may be provided between the "bonded", "attached", "connected", "coupled" and/or "electrically connected/electrically coupled" elements, respectively. However, in accordance with the disclosure, the above-mentioned terms may, optionality, also have the specific meaning that the elements or layers are directly contacted together, i.e. that no intervening elements or layers are provided between the "bonded", "attached", "connected" "coupled" and/or "electrically connected/electrically coupled" elements, respectively.

A power semiconductor chip as mentioned herein may have a vertical structure, that is to say that the semiconductor chip may be fabricated in such a way that electric currents can flow in a direction perpendicular to the main surfaces of the semiconductor chip. A semiconductor chip having a vertical structure has electrodes on its two main surfaces. Vertical power semiconductor chips may, for example, be configured as power MOSFETs (Metal Oxide Semiconductor Field Effect Transistors), IGFTs (Insulated Gate Bipolar Transistors), JFETs (Junction Gate Field Effect transistors), power bipolar transistors, or power diodes. By way of example, the source contact electrode and the gate contact electrode of a power MOSFET may be situated on one main surface, while the drain contact electrode of the power MOSFET may be arranged on the other main surface.

The power semiconductor chip (s) may be covered with an encapsulation material. The encapsulation material may be electrically insulating. The encapsulation material may comprise or be made of any appropriate plastic or polymer material such as, e.g., a duroplastic, thermoplastic or thermosetting material or laminate (prepreg), and may e.g. contain filler materials. Various techniques may be employed to encapsulate the semiconductor chip(s) with the encapsulation material, for example compression molding, injection molding, powder molding, liquid molding, or lamination. Heat and/or pressure may be used to apply the encapsulation material.

Figure 1:
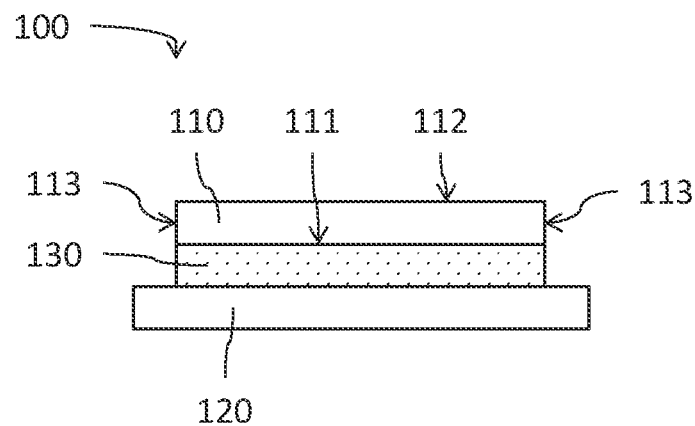
FIG. 1 is a schematic cross section view of a semiconductor package comprising a SiC chip and a diffusion solder bond.

FIG. 1 shows a semiconductor package 100 comprising a power semiconductor chip 110, a leadframe part 120 and a solder joint 130.

The power semiconductor chip 110 is a SiC chip, meaning that the semiconductor material that the power semiconductor chip 110 comprises is SiC. The power semiconductor chip 110 may have a first main side 111 facing the leadframe part 120 and an opposite second main side 112. The power semiconductor chip 110 may further comprise side faces 113 connecting the first and second main sides 111.

According to an example, the power semiconductor chip 110 may comprise a vertical transistor structure, wherein a first. (power) electrode is arranged on the first main side 111 and a second (power) electrode is arranged on the second main side 112. For example, the first (power) electrode may be a drain electrode and the second (power) electrode may be a source electrode. The reverse is also possible. Furthermore, a control electrode like a gate electrode may be arranged on e.g. the second main side 112.

The power semiconductor chip 110 may be thin. The power semiconductor chip 110 may e.g. have a thickness measured between the first main side 111 and the second main side 112 of 350 µm or less, or 250 µm or less, or 150 µm or less, or 100 µm or less, or 50 µm or less. An epitaxial layer of the power semiconductor chip 110 may have a distance to the leadframe part of 300 µm or less, or 200 µm or less, or 150 µm or less, or 100 µm or less, or 50 µm or less. The main sides 111, 112 may e.g. each have a surface area in the range of 1 mm² to 25 mm². The main sides 111, 112 may essentially have a rectangular or quadratic shape.

The leadframe part 120 may comprise Cu. It is also possible that the leadframe part 120 completely consists of Cu. According to another example, the leadframe part 120 may comprise or consist of Ag, Au, or Ni.

The leadframe part 120 may for example have a thickness (measured perpendicular to the main sides 111, 112) of 0.2 mm or more, or 0.5 mm or more, or 1.0 mm or more, or 1.5 mm or more. A ratio of the thickness of the leadframe part 120 to the thickness of the power semiconductor chip 110 may be about 5, about 10, about 15, or about 20.

The leadframe part 120 may be a die carrier. Solely the power semiconductor chip 110 or, according to another example, more than one (power) semiconductor chips may be arranged on the leadframe part 120. Fabricating the semiconductor package 100 may comprise punching or cutting a leadframe in order to obtain the leadframe part 120.

According to an example, the semiconductor package 100 may comprise one or more additional leadframe parts. The one or more additional leadframe parts may be electrically insulated from the leadframe part 120. The one or more additional leadframe parts may be electrically coupled to the power semiconductor chip 110. The one or more additional leadframe parts may e.g. comprise outer leads of the semiconductor package 100.

The solder joint 130 electrically and mechanically couples the power semiconductor chip 110 to the leadframe Part 120. The solder joint 130 comprises at least one intermetallic phase or intermetallic compound. The solder joint 130 may be a diffusion solder joint (i.e. a solder joint that is formed by means of a diffusion soldering process). The solder joint 130 may for example comprise or consist of an intermetallic compound like AgSnCu, or AuSnCu, or CuSn, or NiSnCu, or AgInCu, or AuInCu, or CuIn, or NiInCu.

The solder joint 130 may have a thickness (measured perpendicular to the main sides 111, 112) of 20 µm or less, or 10 µm or less, or 5 µm or less. According to an example, the solder joint 130 may have a thickness in the range of 2 µm to 4 µm. A thin solder joint. 130 may have a smaller thermal resistance than a thick solder joint. Therefore, heat generated by the power semiconductor chip 110 may be more easily dissipated via the solder joint. 130 and the leadframe part 120. Furthermore, a thin solder joint 130 may be less prone to solder bleed-out.

According to an example, a ratio of the thickness of the power semiconductor chip 110 to the thickness of the solder joint 130 may be 10 or more, 20 or more, 50 or more, or 100 or more.

The solder joint 130 may completely cover the first main side 111. According to an example, the solder joint 130 may be flush with all side faces 113. In particular, the semiconductor package 100 may be free of any solder bleed-out. According to another example, some solder bleed-out may be present on at least one of the side faces 113.

FIGS. 2A-2F show a semiconductor package 100 in various stages of fabrication according to a method for fabricating a semiconductor package.

Figure 2A:
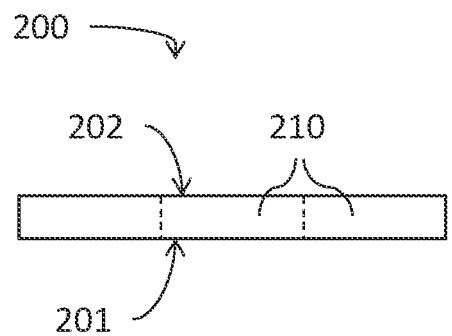

As shown in FIG. 2A, a semiconductor wafer 200 comprising a plurality of power transistor circuits 210 is provided. The semiconductor wafer 200 comprises or consists of SiC. The power transistor circuits 210 may each comprise a vertical transistor structure and may for example each comprise a source, a drain, and a gate electrode. The drain electrodes may for example be arranged on a first main side 201 of the semiconductor wafer 200 and the source and gate electrodes may for example be arranged on an opposing second main side 202 of the semiconductor wafer 200.

Figure 2B:
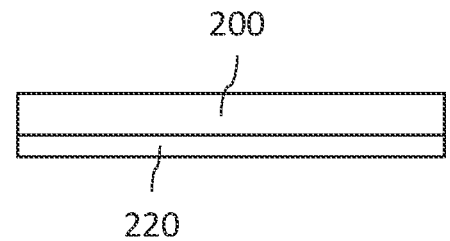

As shown in FIG. 2B, a first metal layer 220 is deposited on the semiconductor wafer 200. The first metal layer 220 may be deposited on the first main side 201. The first metal layer 220 may completely cover the first main side 201. The first metal layer 220 may comprise a solder material suitable for diffusion soldering, e.g. AgSn, AuSn, CuSn, NiSn, AgIn, CuIn, or NiIn. The first metal layer 220 may be deposited on the semiconductor wafer 200 using any suitable depositing technique, for example dispensing, (chemical) vapor deposition, sputtering, etc.

Figure 2C:
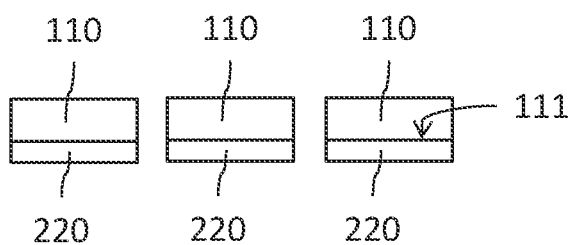

As shown in FIG. 2C, the semiconductor wafer 200 is singulated into individual power semiconductor chips 110, wherein each power semiconductor chip 110 comprises at least one power transistor circuit 210. The first main side 111 of the singulated power transistor chips 110 may be (completely) covered by the first metal layer 220. Singulating may comprise cutting the semiconductor wafer 200 along cutting lines, e.g. mechanically or using a laser. Furthermore, the first metal layer 220 may be cut simultaneously with the semiconductor wafer 200. The side faces 113 of the singulated power semiconductor chips 110 may comprise some contamination of the material of the first metal layer 220. Similarly, the first metal layer 220 may comprise some contamination of the material of the semiconductor wafer 200 at the side faces 113.

Figure 2D:
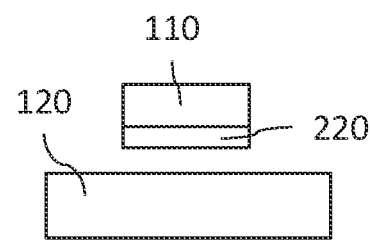

As shown in FIG. 2D, a leadframe part 120 is provided. The leadframe part 120 may comprise or consist of Cu. Providing the leadframe part 120 may optionally comprise cutting or punching the leadframe part out of a leadframe strip.

As shown in FIG. 2E, at least one of the power semiconductor chips 110 is arranged on the leadframe part. 120 such that the first metal layer 220 faces the leadframe part 120.

Arranging the power semiconductor chip 110 on the leadframe part. 120 may for example comprise using a pick-and-place process.

As shown in FIG. 2F, the at least one power semiconductor chip 110 is diffusion soldered to the leadframe part 120 such that the solder joint 130 is formed. The solder joint 130 may consist of material of the first metal layer 220 and of material of the leadframe part 120, together forming at least one intermetallic phase.

At least some or all of the processes described with respect to FIGS. 2A-2F may be performed in a controlled atmosphere. For example, an atmosphere comprising 88% $N_2$ and 12% $H_2$ may be used. The controlled atmosphere may for example help to prevent oxidation of Cu.

According to an example, diffusion soldering the at least one power semiconductor chip 110 to the leadframe part 120 may further comprise applying heat of 380° C. or more. For example, the power semiconductor chip 110, first metal layer 220 and leadframe part 120 as shown in FIG. 2E may be placed into an oven and heated up to 380° C. or more. The exact temperature to be used may for example depend on the material combination of the first metal layer 220 and leadframe part 120 and/or on the desired length of time of the diffusion soldering process.

FIG. 3 shows a press 300 that is configured to press the power semiconductor chip 110 and first metal layer 220 onto the leadframe part 120. Diffusion soldering the power semiconductor chip 110 to the leadframe part 120 as e.g. described with respect to FIGS. 2A-2F may optionally comprise pressing the at least one power semiconductor chip 110 onto the leadframe part 120. This may e.g. be done using the press 300.

The press 300 may e.g. be configured to apply a pressure of 1 N/mm² or more, 2 N/mm² or more, 3 N/mm² or more, or 1 N/mm² or more. Since the power semiconductor chip 110 is a SiC chip, it may be able to withstand much higher pressures without being damaged than e.g. Si chips.

Pressing the power semiconductor chip 110 and first metal layer 220 onto the leadframe part 120 may e.g. be done while heat is applied as described above. Heat and pressure in tandem may facilitate the formation of the at least one intermetallic phase. A higher pressure may reduce the necessary length of time for the diffusion soldering process.

According to an example, the press 300 may be part of a pick-and-place apparatus that is configured to place the Power semiconductor chip 110 onto the leadframe part 120. In other words, placing the power semiconductor chip 110 onto the leadframe part 120 and pressing the power semiconductor chip 110 down onto the leadframe part 120 may be performed by the press 300.

According to another example, the power semiconductor chip 110 is picked up and placed onto the leadframe part 120 by an apparatus different from the press 300 and the press 300 is only used after the power semiconductor chip 110 has been placed onto the leadframe part 120.

FIG. 4 shows a stack 400 comprising the power semiconductor chip 110, the first metal layer 220 and at least one additional metal layer. The one or more additional metal layers may be arranged between the power semiconductor chip 110 and the first metal layer 220. The stack 400 may be comprised in the semiconductor package 100.

The one or more additional metal layers may have various functions and may, for example, be configured as diffusion barrier, seed layer, adhesion layer, etc. The one or more additional metal layers may comprise any suitable metal or metal alloy.

According to an example, the stack 400 may comprise a first additional metal layer 402 which may directly abut the power semiconductor chip 110. The first additional metal layer 402 may e.g. comprise or consist of TiSi.

According to an example, the stack 400 may comprise a second additional metal layer 404. The second additional metal layer 404 may directly abut the first additional metal layer 402. The second additional metal layer 404 may e.g. comprise or consist of NiV.

According to an example, the stack 400 may comprise a third additional metal layer 406. The third additional metal layer 406 may directly abut the second additional metal layer 404. The third additional metal layer 406 may e.g. comprise or consist of Al.

According to an example, the stack. 100 may comprise a fourth additional metal layer 408. The fourth additional metal layer 408 may directly abut the third additional metal layer 406. The fourth additional metal layer 408 may e.g. comprise or consist of Ti. The first metal layer 220 may directly abut the additional metal layer 408.

According to a further example, the stack 400 may comprise only one, two or three of the additional metal layers 402 to 408. For example, the stack 400 may comprise the first, second and fourth additional metal layers 402, 101 and 408, but not the third metal layer 106. In this case, the fourth additional metal layer 408 may directly abut the second additional metal layer 404.

Furthermore, the individual additional metal layers 402 to 408 need not necessarily comprise the exemplary metals described above, but may comprise one or more other suitable metals. The individual additional metal layers 402 to 408 may have any suitable thickness, for example, each layer may have a thickness in the range of 100 nm to 300 nm.

Figure 5:
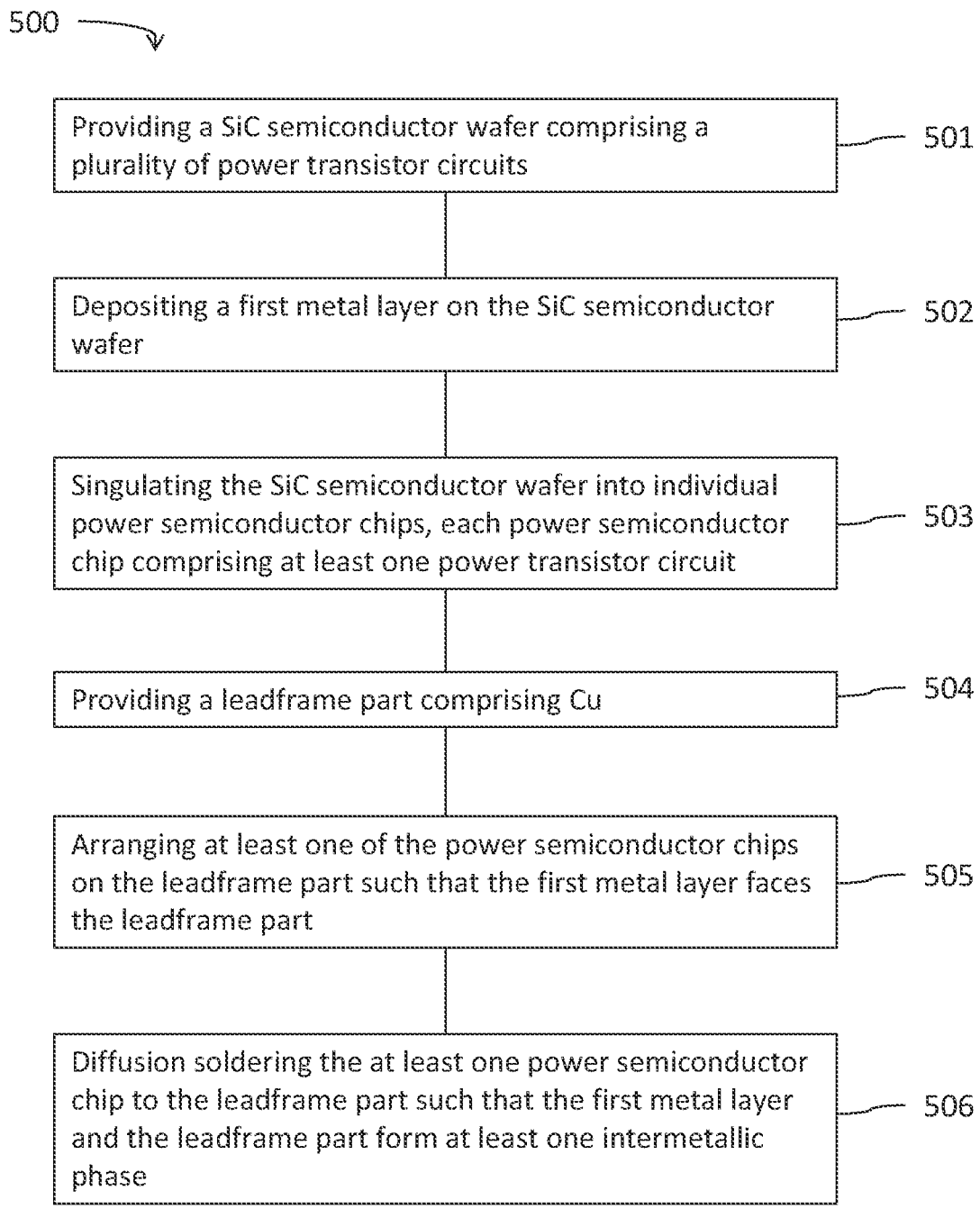
FIG. 5 is a flow chart showing a method for fabricating a semiconductor package.

FIG. 5 is a flow chart of a method 500 for fabricating a semiconductor package. The method 500 may e.g. be used to fabricate the semiconductor package 100.

The method 500 comprises at 501 providing a SiC semiconductor wafer comprising a plurality of power transistor circuits, at 502 depositing a first metal layer on the SiC semiconductor wafer, at 503 singulating the SiC semiconductor wafer into individual power semiconductor chips, each power semiconductor chip comprising at least one power transistor circuit, at 504 providing a leadframe part comprising Cu, at 505 arranging at least one of the power semiconductor chips on the leadframe part such that the first metal layer faces the leadframe part, and at 506 diffusion soldering the at least one power semiconductor chip to the leadframe part such that the first metal laver and the leadframe part form at least one intermetallic phase.

According to an example of method 500, the depositing 502 of the first metal layer onto the SiC semiconductor wafer may comprise using a sputtering technique, a dispensing technique, a. (chemical) vapor deposition technique or any other suitable technique known in the art. The first metal layer may e.g. be deposited such that is has a thickness of 1.2 μm or less.

Method 500 may optionally comprise the application of heat and/or pressure during the diffusion soldering 506 of the at least one power semiconductor chip. For example, a heat of 380° C. or more and/or a pressure of 4 N/mm² or more may be applied onto the first metal layer.

Figure 6:
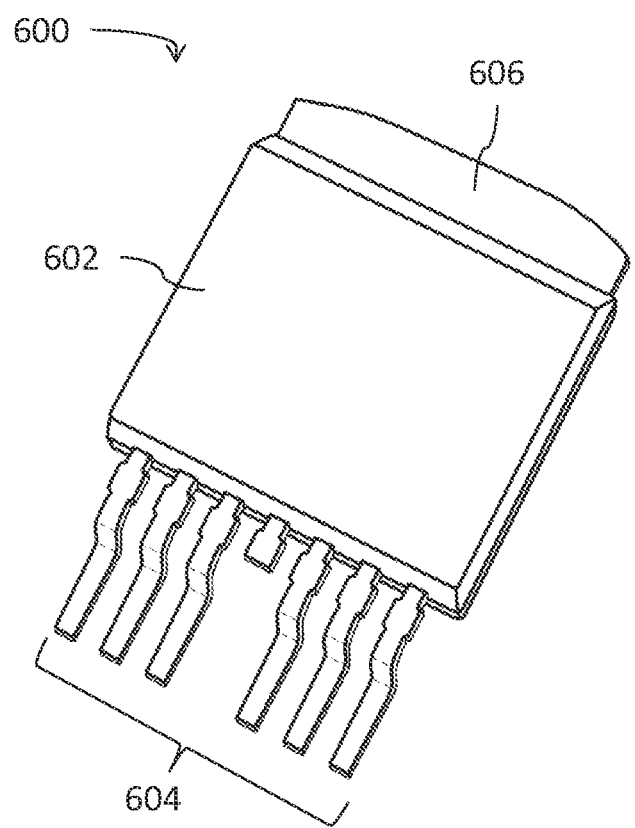
FIG. 6 is a perspective view of a semiconductor package in the form of a surface mounted device.

FIG. 6 is a perspective view of a semiconductor package 600, which may be similar or identical to the semiconductor package 100.

Semiconductor package 600 comprises all components described with respect to semiconductor package 100 and it further comprises an encapsulation body 602 and external contacts 604. The encapsulation body 602 may e.g. be a molded body or a laminated body. The external contacts 604 may e.g. be parts of a leadframe. The power semiconductor chip may be electrically coupled to one or more of the external contacts 604.

The semiconductor package 600 may optionally comprise a metal plate 606. The metal plate 606 may be identical with the leadframe part 120. The metal plate 606 may be at least partially exposed at the encapsulation body 602 and it may be configured to help dissipate heat generated by the power semiconductor chip 110 and/or to electrically contact a power electrode of the power semiconductor chip 110 from the outside.

According to an example, the semiconductor package 600 may be a surface mounted device (SMD). However, it is also possible that the semiconductor package 600 is a through-hole device (THD). The semiconductor package 600 may be a standardized transistor outline (TO) package, for example a package of the TO 263-7 type.

In the following, the semiconductor package and the method for fabricating a semiconductor package are further described using particular examples.

Example 1 is a semiconductor package comprising a Power semiconductor chip comprising SiC, a leadframe part comprising Cu, wherein the power semiconductor chip is arranged on the leadframe part, and a solder joint electrically and mechanically coupling the power semiconductor chip to the leadframe part, wherein the solder joint comprises at least one intermetallic phase.

Example 2 is the semiconductor package of example 1, wherein the power semiconductor chip is configured to operate at a temperature of 175° C. or more, or a temperature of 200° C. or more.

Example 3 is the semiconductor package of example 1 or 2, wherein the solder joint comprises AgSnCu, AuSnCu, CuSn, NiSnCu, AgInCu, AuInCu, CuIn, or NiInCu.

Example 4 is the semiconductor package of one of the preceding examples, wherein the solder joint, has a thickness of 10 μm or less.

Example 5 is the semiconductor package of one of the preceding examples, wherein the power semiconductor chip has a thickness of 200 μm or less, or 150 μm or less, or 100 μm or less.

Example 6 is the semiconductor package of one of the preceding examples, wherein a distance between a gate oxide of the power semiconductor chip and the leadframe part is 300 μm or less, or 200 μm or less, or 150 μm or less, or 100 μm or less, or 50 μm or less.

Example 7 is the semiconductor package of one of the preceding examples, further comprising a NiV layer arranged between the power semiconductor chip and the solder joint, wherein the NiV layer has a thickness of 300 nm or less.

Example 8 is the semiconductor package of one of the preceding examples, wherein the power semiconductor chip has a first main face, an opposite second main face and side faces connecting the first main face and the second main face, wherein the solder joint is arranged on the first main face and completely covers the first main face, and wherein the solder joint is flush with all side faces.

Example 9 is a method for fabricating semiconductor package, the method comprising: providing a Sit semiconductor wafer comprising a plurality of power transistor circuits, depositing a first metal layer on the SiC semiconductor wafer, singulating the SiC semiconductor wafer into individual power semiconductor chips, each power semiconductor chip comprising at least one power transistor circuit, providing a leadframe part comprising Cu, arranging at least one of the power semiconductor chips on the leadframe part such that the first metal layer faces the leadframe part, and diffusion soldering the at least one power semiconductor chip to the leadframe part such that the first metal layer and the leadframe part form at least one intermetallic phase.

Example 10 is the method of example 9, wherein the first metal layer comprises AgSn, AuSn, CuSn, NiSn, AgIn, AuIn, CuIn, or NiIn.

Example 11 is the method of example 9 or 10, wherein depositing the first metal layer on the SiC semiconductor wafer comprises sputtering the first metal layer to a thickness of 1.2 μm or less.

Example 12 is the method of one of examples 9 to 11, wherein diffusion soldering the at least one power semiconductor chip to the leadframe part further comprises applying heat of 380° C. or more.

Example 13 is the method of one of examples 9 to 12, wherein diffusion soldering the at least one power semiconductor chip to the leadframe part further comprises: pressing the at least one power semiconductor chip onto the leadframe part with a pressure of 411/mm$^2$ or more.

Example 14 is the method of one of examples 9 to 13, wherein a bond line thickness after diffusion soldering is 4 μm or; less.

Example 15 is the method of one of examples 9 to 14, wherein the at least one power semiconductor chip has a thickness of 150 μm or less.

Example 16 is the semiconductor package of one of examples 1 to 8, wherein the leadframe part has a thickness of 0.5 mm or more.

Example 17 is the semiconductor package of example 1, wherein the solder joint is a diffusion solder joint.

Example 19 is an apparatus comprising means for performing the method according to one of the examples 9 to 15.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a. "means") used to describe such components are intended to correspond, unless otherwise indicated, to any component or structure which performs the specified function of the described component. (e.g., that is functionally equivalent), even though not structurally equivalent to the disclosed structure which performs the function in the herein illustrated exemplary implementations of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A semiconductor package, comprising:
a power semiconductor chip comprising SiC;

a leadframe part comprising Cu, wherein the power semiconductor chip is arranged on the leadframe part; and a solder joint electrically and mechanically coupling the power semiconductor chip to the leadframe part, wherein the solder joint comprises at least one intermetallic phase, wherein the solder joint has a thickness of 10 µm or less.

2. The semiconductor package of claim 1, wherein the power semiconductor chip is configured to operate at a temperature of 175° C. or more, or a temperature of 200° C. or more.

3. The semiconductor package of claim 1, wherein the solder joint comprises AgSnCu, AuSnCu, CuSn, NiSnCu, AgInCu, AuInCu, CuIn, or NiInCu.

4. The semiconductor package of claim 1, wherein the power semiconductor chip has a thickness of 200 µm or less, or 150 µm or less, or 100 µm or less.

5. The semiconductor package of claim 1, further comprising:

a NiV layer arranged between the power semiconductor chip and the solder joint, wherein the NiV layer has a thickness of 300 nm or less.

6. The semiconductor package of claim 1, wherein the power semiconductor chip has a first main face, an opposite second main face and side faces connecting the first main face and the second main face, wherein the solder joint is arranged on the first main face and completely covers the first main face, and wherein the solder joint is flush with all side faces.

7. The semiconductor package of claim 1, wherein a ratio of a thickness of the power semiconductor chip to a thickness of the solder joint is 10 or more.

8. A semiconductor package, comprising:

a power semiconductor chip comprising SiC;

a leadframe part comprising Cu, wherein the power semiconductor chip is arranged on the leadframe part; and a solder joint electrically and mechanically coupling the power semiconductor chip to the leadframe part, wherein the solder joint comprises at least one intermetallic phase, wherein the power semiconductor chip has a thickness of 200 µm or less, or 150 µm or less, or 100 µm or less.

9. The semiconductor package of claim 8, wherein the power semiconductor chip is configured to operate at a temperature of 175° C. or more, or a temperature of 200° C. or more.

10. The semiconductor package of claim 8, wherein the solder joint comprises AgSnCu, AuSnCu, CuSn, NiSnCu, AgInCu, AuInCu, CuIn, or NiInCu.

11. The semiconductor package of claim 8, wherein the solder joint has a thickness of 10 µm or less.

12. The semiconductor package of claim 8, further comprising:

a NiV layer arranged between the power semiconductor chip and the solder joint, wherein the NiV layer has a thickness of 300 nm or less.

13. The semiconductor package of claim 8, wherein the power semiconductor chip has a first main face, an opposite second main face and side faces connecting the first main face and the second main face, wherein the solder joint is arranged on the first main face and completely covers the first main face, and wherein the solder joint is flush with all side faces.

14. The semiconductor package of claim 8, wherein a ratio of a thickness of the power semiconductor chip to a thickness of the solder joint is 10 or more.

15. A semiconductor package, comprising:

a power semiconductor chip comprising SiC;

a leadframe part comprising Cu, wherein the power semiconductor chip is arranged on the leadframe part; and a solder joint electrically and mechanically coupling the power semiconductor chip to the leadframe part, wherein the solder joint comprises at least one intermetallic phase, wherein a ratio of a thickness of the power semiconductor chip to a thickness of the solder joint is 10 or more.

16. The semiconductor package of claim 15, wherein the power semiconductor chip is configured to operate at a temperature of 175° C. or more, or a temperature of 200° C. or more.

17. The semiconductor package of claim 15, wherein the solder joint comprises AgSnCu, AuSnCu, CuSn, NiSnCu, AgInCu, AuInCu, CuIn, or NiInCu.

18. The semiconductor package of claim 15, wherein the solder joint has a thickness of 10 µm or less.

19. The semiconductor package of claim 15, wherein the power semiconductor chip has a thickness of 200 µm or less, or 150 µm or less, or 100 µm or less.

20. The semiconductor package of claim 15, further comprising:

a NiV layer arranged between the power semiconductor chip and the solder joint, wherein the NiV layer has a thickness of 300 nm or less.

\* \* \* \* \*